United States Patent
Pennings

[11] 4,020,543
[45] May 3, 1977

[54] TWO-PIECE CAPILLARY TIP BONDING TOOL

[75] Inventor: Matheus D. Pennings, Los Altos Hills, Calif.

[73] Assignee: Sola Basic Industries, Inc., Milwaukee, Wis.

[22] Filed: June 26, 1975

[21] Appl. No.: 590,516

[52] U.S. Cl. .................... 29/423; 228/4.5; 228/44.1 A; 29/527.4

[51] Int. Cl.² ............... B23P 17/00; B23K 3/02; H01R 43/02

[58] Field of Search ........... 228/44.1, 1, 4.5, 3.1, 228/54, 55, 904; 29/527.2, 527.4, 423

[56] References Cited

UNITED STATES PATENTS

| 3,472,443 | 10/1969 | Holyl et al. ............ 29/423 X |
| 3,917,148 | 11/1975 | Runyon ................. 228/54 |

Primary Examiner—Gary L. Smith
Assistant Examiner—K. J. Ramsey
Attorney, Agent, or Firm—Blakely, Sokoloff, Taylor & Zafman

[57] ABSTRACT

A lead wire capillary bonding tool formed from a rod with a core, the rod having a shaped end upon which tungsten carbide or refractory metal is vapor deposited and then the core removed.

5 Claims, 7 Drawing Figures

TWO-PIECE CAPILLARY TIP BONDING TOOL

This invention relates to a capillary tip lead wire bonding tool for use in bonding lead wires to articles such as semiconductors.

It is necessary in the manufacture of semiconductors to attach small diameter lead wires thereto. The wires are extremely small, being as small as 0.0007 inch in diameter, and the area to which they are attached is very small, e.g., as small as 0.003 inch diameter. Various tools have been used for this purpose, such as shown in Christensen U.S. Pat. No. 3,358,897. One of the problems has been in the proper sizing of the capillary aperture, especially because of the use of tungsten carbide and similar material for the tip portion. Such a metal is so hard that it is difficult to drill the capillary hole accurately because of the smallness thereof. It is old to vapor deposit tungsten carbide on articles, such as shown in Lander U.S. Pat. No. 2,602,033. Also, vapor-deposited tungsten carbide is described in U.S. Pat. Nos. 3,472,443 and 3,613,766.

One of the objects of the invention is to provide an improved method of making an improved lead wire bonding capillary tip.

In one aspect of the invention, a tubular member has a metal core placed therein. One end of the rod is shaped with a projection sized properly for the capillary passage desired. A refractory metal, such as tungsten carbide, is vapor deposited thereon and then the core removed. The end is then cut so as to open the passage.

These and other objects, advantages and features of the present invention will become apparent from the following description and drawings which are merely exemplary.

Figure 1:
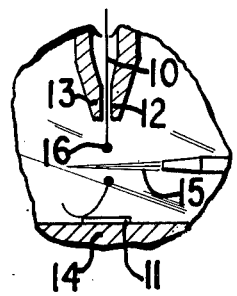
FIGS. 1, 2, 3 and 4 are schematic illustrations depicting the steps in bonding a lead wire to an article.
Figure 2:
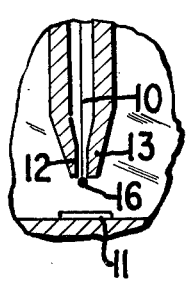
Figure 3:
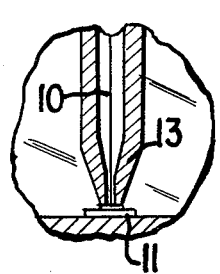
Figure 4:
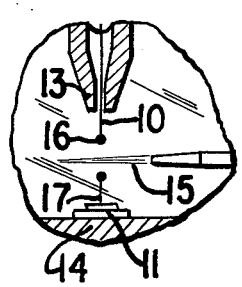

The lead wire bonding tool of the present invention is adapted to bond an electric lead wire 10 (FIG. 1) in a conventional manner to a semiconductor means 11. The lead wire is of a very small diameter, for example, as small as 0.0007 inch, the wire being threaded through capillary passage 12 of the tip 13. It is necessary that the diameter of the capillary passage be only slightly greater than that of the wire for proper guiding thereof. As is known in the art, the semiconductor to which a lead is to be secured can be supported on a heated platform or table 14 which is movable relative to the tip so as to align the semiconductor with the wire. A flame 15, such as from a suitable gas torch means, severs wire 10 by melting and forming a bead or ball 16 at the lower end thereof. The capillary tip 13 is lowered, as seen in FIG. 2, so as to engage ball 16 and press it against the semiconductor material 11 as seen in FIG. 3. Thereafter, the tip 13 is raised as seen in FIG. 4 and flame 15 activated to sever wire 10, leaving the bonded wire or lead 17 attached to semiconductor 11. The patent to Christensen No. 3,358,897 shows in more detail the just-described process. Other bonding and cut-off means can be used.

Figure 5:
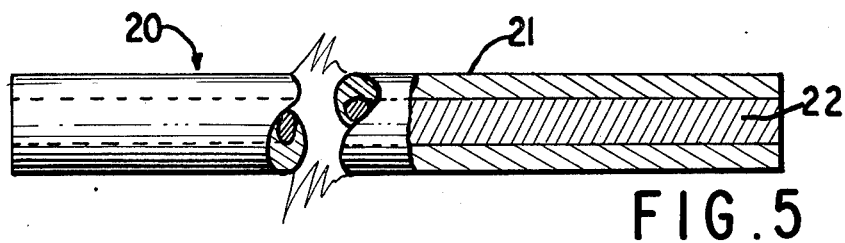
FIG. 5 is a broken view partially in section of a rod used in producing the tool.

As previously mentioned, the forming of orifice or capillary passage 12, which must be accurate, is extremely difficult in hard material such as tungsten carbide. It also has been found difficult to produce capillary tips of tungsten carbide joined to a softer metal tool shank. In order to produce such a device, rod 20 (FIG. 5) is composed of an outer tube 21 of a material such as 304 stainless steel. A core 22 is placed within the tube 21, the core being of a metal which can be removed at a later step. One example of such a core is cold rolled steel. The core 22 can be inserted into the tube 21 and then cold-welded to the outer tube by drawing through a die.

Figure 6:
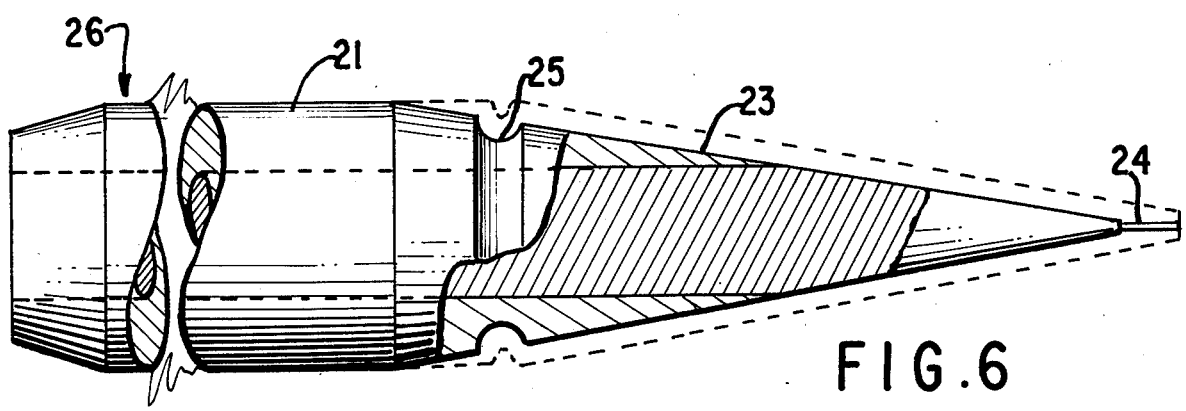
FIG. 6 is a broken enlarged view showing the end of the rod of FIG. 5 shaped for receiving a vapor-deposited tip, the dashed lines indicating the tip to be deposited thereon.
Figure 7:
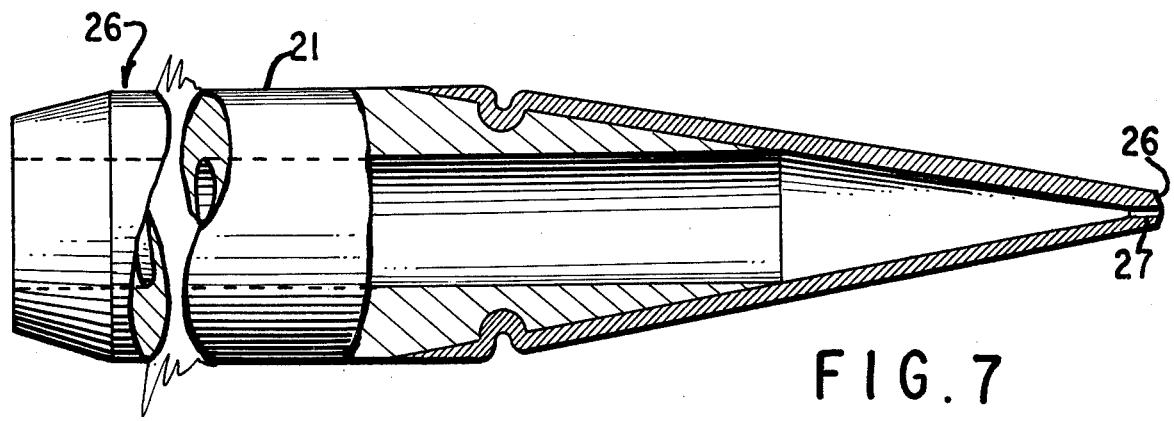
FIG. 7 is similar to FIG. 6 showing the capillary tip after the core is removed.

Following formation of the rod, which as previously mentioned is of very small diameter, the exterior is placed in a suitable machine and formed into the shape or contour seen in FIG. 6 having a taper 23 with a tip member or projection 24. The tip member or projection can be of substantially the exact size of the capillary passage to be left in the final formed tip. A groove 25 can be cut into the tube 21 so as to assist in anchoring the tip portion to the shank 26 of the bonding tool.

Tungsten carbide then can be vapor deposited on the tip end of the formed rod of FIG. 6. The thickness is illustrated by the dashed lines. Any suitable type of vapor deposition can be used to produce the integral mass of tungsten carbide on the tool. The deposition is without a cementitious material therein which has been found to cause difficulties. Thereafter, the core can be removed by any suitable means. As an example, the core can be removed by chemical etching.

The tip 26 can be cut off before or after the core is removed. As set forth in U.S. Pat. No. 3,358,897, the length of the capillary passage 27 preferably should be about three to ten times the diameter of the passage.

After removing the tip, a minimum polishing operation completes the capillary bonding tool. Previous methods of producing tungsten carbide capillary bonding tools have required extensive machining of the hard material. In the present invention, the tungsten carbide layer in its final thickness, for example, .005 to .007 inch, greatly reduces the deposition time in addition to eliminating additional machinery operations.

Other refractory metals without cementitious material can be used. Other refractory metal, such as titanium, rhenium, molybdenum and alloys thereof can be used. These include tungsten-molybdenum, tungsten-rhenium, tantalum carbide and columbium carbide.

The lead wire bonding tool of the present invention produces a tool of accurate dimensions and which is extremely durable.

It should be apparent that changes can be made in details of construction and materials without departing from the spirit of the invention except as defined in the appended claims.

What is claimed is:

1. The method of making a lead wire capillary bonding tool having a wire capillary passage therein comprising the steps of filling a tubular metal tool shank member with a removable core material, shaping one end of said tubular metal tool shank member with the core therein to provide a contour of the interior of a capillary tip having a taper and a small projection the size of the wire capillary passage, vapor depositing refractory metal without cementitious binder on the shaped capillary contour including a portion of the shank, and then removing said core.

2. The method of making a lead wire capillary bonding tool as claimed in claim 1 wherein the refractory metal is tungsten carbide.

3. The method of making a lead wire capillary bonding tool as claimed in claim 2 wherein the tubular metal tool shank member is stainless steel.

4. The method of making a lead wire capillary bonding tool as claimed in claim 1 wherein the tubular metal tool shank member is stainless steel.

5. The method of making a lead wire capillary bonding tool as claimed in claim 1 wherein the end of the vapor deposited refractory metal is cut off to open the capillary passage therethrough.

* * * * *